United States Patent
Huang

(10) Patent No.: US 8,143,130 B1
(45) Date of Patent: Mar. 27, 2012

(54) METHOD OF MANUFACTURING DEPLETION MOS DEVICE

(75) Inventor: Tsung-Yi Huang, Hsinchu (TW)

(73) Assignee: Richtek Technology Corporation, R.O.C., Hsin-Chu (TW)

( * ) Notice: Subject to any disclaimer, the term of this patent is extended or adjusted under 35 U.S.C. 154(b) by 0 days.

(21) Appl. No.: 12/910,051

(22) Filed: Oct. 22, 2010

(51) Int. Cl.
*H01L 21/8236* (2006.01)

(52) U.S. Cl. ......... 438/289; 257/E21.631; 257/E27.061; 257/402

(58) Field of Classification Search .................. 438/289; 257/297, 355, 402, 403, 404, 452, E21.631, 257/E27.061
See application file for complete search history.

(56) References Cited

U.S. PATENT DOCUMENTS

| | | | |
|---|---|---|---|
| 7,365,402 B2 * | 4/2008 | Ma | 257/408 |
| 2008/0122006 A1 * | 5/2008 | Williams et al. | 257/371 |
| 2008/0237703 A1 * | 10/2008 | Lin et al. | 257/336 |
| 2009/0152628 A1 * | 6/2009 | Kikuchi et al. | 257/339 |
| 2011/0024839 A1 * | 2/2011 | Zinn et al. | 257/343 |
| 2011/0133273 A1 * | 6/2011 | Shima | 257/336 |

FOREIGN PATENT DOCUMENTS

WO   WO 2010023722 A1 *   3/2010

* cited by examiner

*Primary Examiner* — William D Coleman
*Assistant Examiner* — Christine Enad
(74) *Attorney, Agent, or Firm* — Tung & Associates

(57) ABSTRACT

The present invention discloses a method of manufacturing a depletion metal oxide semiconductor (MOS) device. The method includes: providing a substrate; forming a first conductive type well and an isolation region in the substrate to define a device area; defining a drift region, a source, a drain, and a threshold voltage adjustment region, and implanting second conductive type impurities to form the drift region, the source, the drain, and the threshold voltage adjustment region, respectively; defining a breakdown protection region between the drain and the threshold voltage adjustment region, and implanting first conductive type impurities to form the breakdown protection region; and forming a gate in the device area; wherein a part of the breakdown protection region is below the gate, and the breakdown protection region covers an edge of the threshold voltage adjustment region.

8 Claims, 4 Drawing Sheets

METHOD OF MANUFACTURING DEPLETION MOS DEVICE

BACKGROUND OF THE INVENTION

1. Field of Invention

The present invention relates to a method of manufacturing a depletion metal oxide semiconductor (MOS) device; particularly, it relates to a method of manufacturing a depletion MOS device with breakdown protection.

2. Description of Related Art

FIG. 1 shows a cross-section view of a prior art depletion double diffused drain MOS (DDDMOS) device. As shown in FIG. 1, a P-type well 11 and isolation regions 12 are formed in a P-type substrate 1 to define a device area 100. The isolation regions 12 for example are formed by local oxidation of silicon (LOCOS). In the device area 100, a gate 13, a drift region 14, a source 15a, a drain 15, a P-type heavily doped region 16, and a threshold voltage adjustment region 17 are formed. The P-type well 11 may instead be the substrate 1 itself. The drift region 14, the source 15a, the drain 15, and the threshold voltage adjustment region 17 are formed by lithography and implantation with N-type impurities. The P-type heavily doped region 16 is formed by lithography and implantation with P-type impurities. The source 15a and the drain 15 are located beneath the gate 13 at both sides thereof, respectively. The drift region 14 is located at the drain side and part of it is beneath the gate 13. Part of the threshold voltage adjustment region 17 is beneath the gate 13; the threshold voltage adjustment region 17 converts an enhancement device to a depletion device, and it also serves for adjusting the threshold voltage of the depletion MOS device. The source 15a and the P-type heavily doped region 16 are separated by an isolation region 12. Because both the threshold voltage adjustment region 17 and the drift region 14 are doped with N-type impurities, breakdown more likely occurs in the depletion MOS device as compared to an enhancement MOS device. Particularly, at the region indicated by a dash-lined circle, i.e., the region beneath the edge of the gate 13 at the drain side, band-to-band breakdown easily occurs, so the depletion MOS device has a lower breakdown voltage. The lower breakdown voltage limits the applications of the prior art depletion MOS device.

FIG. 2 shows a cross-section view of a prior art depletion lateral diffused metal oxide semiconductor (LDMOS) device. Compared to the prior art shown in FIG. 1, the depletion LDMOS device shown in FIG. 2 has a body 18, and part of its gate 13 is located on the isolation region 12. Still similarly, this prior art depletion LDMOS device has the same problem as the aforementioned depletion DDDMOS device, that is, band-to-band breakdown easily occurs at the region indicated by a dash-lined circle shown in FIG. 2, and the low breakdown voltage limits its applications.

FIG. 3 shows a cross-section view of another prior art, which is another type of depletion double diffused drain MOS device, referred to as a depletion DMOS device. Similarly, this prior art depletion DMOS device has the same problem that band-to-band breakdown easily occurs at the region indicated by a dash-lined circle shown in FIG. 3, and the low breakdown voltage limits its applications.

Conventionally, to solve the aforementioned problem, engineers focused their studies on adjusting the densities or the diffusion regions of the impurities which form the drift region 14, the source 15a, the drain 15, and the threshold voltage adjustment region 17, but no effective solution has been proposed. The reason is thus: a circuit generally does not only include depletion MOS devices, but also includes enhancement MOS devices. In a manufacturing process of the circuit, the same implantation parameters for the drift regions 14, the sources 15a, and the drains 15 are applied to both enhancement and depletion MOS devices, and next the threshold voltage adjustment region 17 is formed in the depletion MOS devices to convert selected enhancement MOS devices to depletion MOS devices. In other words, the enhancement devices and the depletion devices use the same parameters for the drift regions 14, the sources 15a, and the drains 15; if any parameter of the depletion devices is adjusted, it will impact the performance of the enhancement devices. Therefore, from the manufacturing point of view, the only parameter which can be adjusted is the implantation parameter of the threshold voltage adjustment region 17. However, the impurity density of the threshold voltage adjustment region 17 can not be too low, or else the selected enhancement devices can not be converted to depletion devices. Therefore, restricted by the aforementioned limitations, the prior art can not solve the band-to-band breakdown problem effectively.

In view of the foregoing, the present invention provides a method of manufacturing a depletion MOS device, which can increase the breakdown voltage of the device to broaden its applications.

SUMMARY OF THE INVENTION

The objective of the present invention is to provide a method of manufacturing a depletion MOS device.

To achieve the objective mentioned above, the present invention provides a method of manufacturing a depletion MOS device, comprising: providing a substrate; forming a first conductive type well and an isolation region in the substrate to define a device area; defining a drift region, a source, a drain, and a threshold voltage adjustment region in the device area, and implanting second conductive type impurities to form the drift region, the source, the drain, and the threshold voltage adjustment region, respectively; defining a breakdown protection region between the drain and the threshold voltage adjustment region, and implanting first conductive type impurities to form the breakdown protection region; and forming a gate in the device area.

In a preferred embodiment, the first conductive type is P-type and the second conductive type is N-type. In another preferred embodiment, the first conductive type is N-type and the second conductive type is P-type.

In one embodiment, the isolation region is formed by LOCOS or shallow trench isolation (STI).

In one embodiment, the breakdown protection region is defined by a mask dedicated to forming the breakdown protection region.

In a preferred embodiment, the breakdown protection region is defined by a lightly doped drain (LDD) region mask which also defines a first conductive type LDD region of another MOS device with an opposite conductive type in the same substrate.

In a preferred embodiment, the breakdown protection region is defined by an anti-punch through region mask which also defines a first conductive type anti-punch through region of another MOS device with an opposite conductive type in the same substrate.

In a preferred embodiment, the depletion MOS device is a DDDMOS device or an LDMOS device.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, but not drawn according to actual scale.

Figure 1:
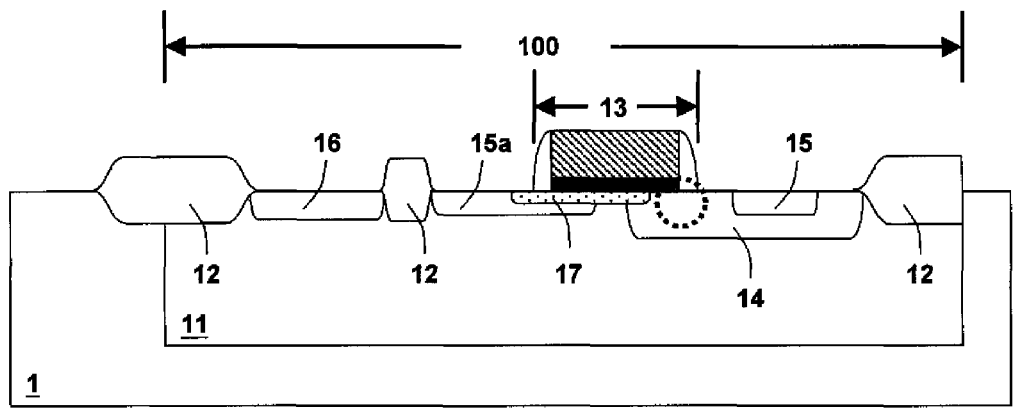
FIG. 1 shows a cross-section view of a prior art depletion DDDMOS device.
Figure 2:
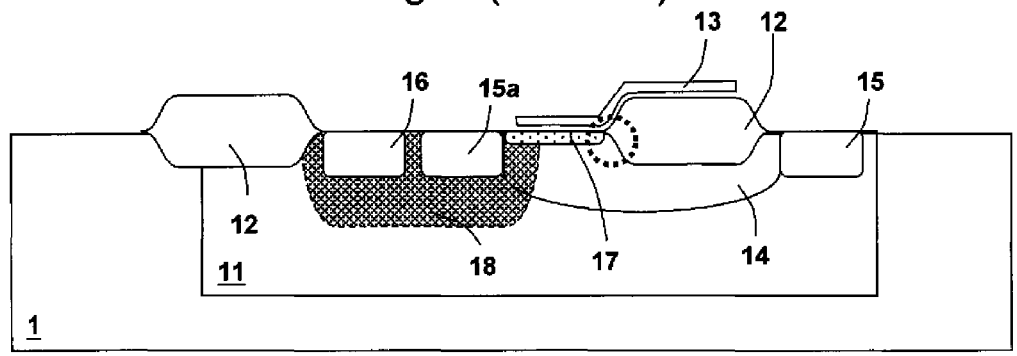
FIG. 2 shows a cross-section view of a prior art depletion LDMOS device.
Figure 3:
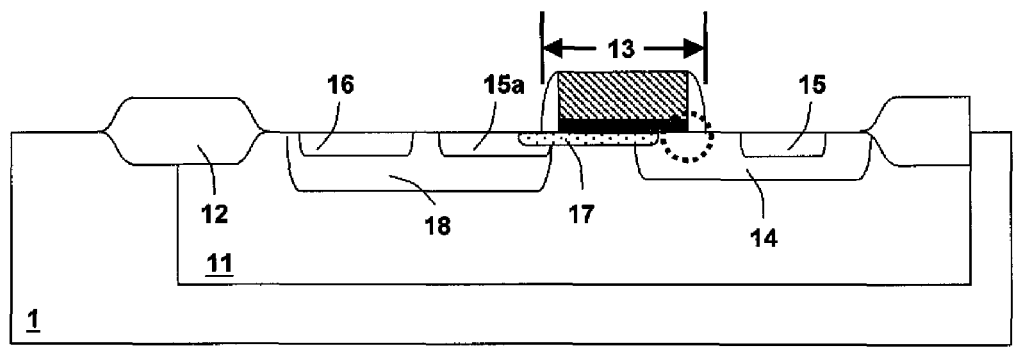
FIG. 3 shows a cross-section view of another prior art depletion double diffused drain MOS device.
Figure 4A:
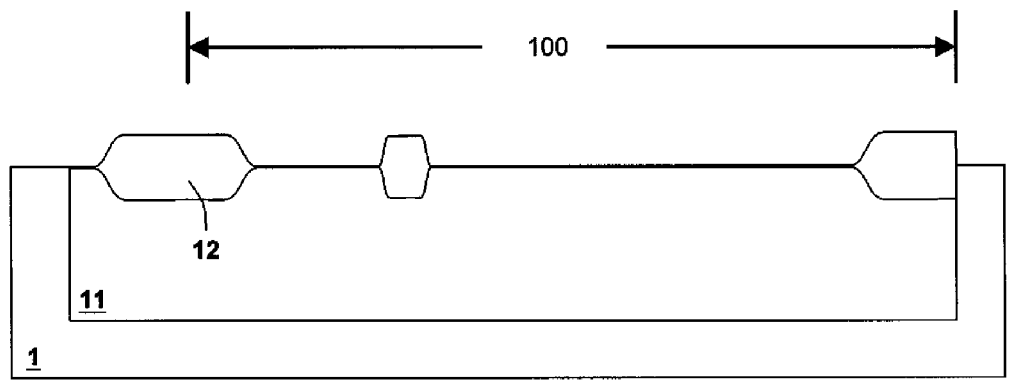
FIGS. 4A-4D are cross-section views showing a manufacturing process according to a first embodiment of the present invention.
Figure 4B:
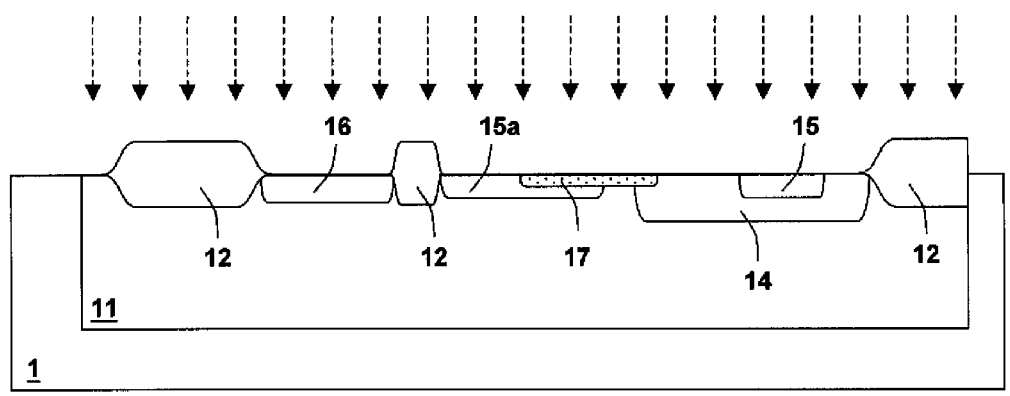

FIGS. 4A-4D are cross-section views showing a process according to a first embodiment of the present invention. This embodiment shows a method of manufacturing a depletion DDDMOS device 10. As shown in FIG. 4A, a substrate 1 is provided, which is, for example but not limited to, a P-type or N-type silicon substrate. A first conductive type well 11 and isolation regions 12 are formed in the substrate 1 to define a device area 100. As shown in FIG. 4A, the device area 100 is defined between the isolation regions 12. The isolation regions 12 may be formed by LOCOS or STI. In this embodiment, the isolation region 12 is illustrated as a LOCOS structure by way of example. The first conductive type well 11 may be the substrate 1 itself, or may be formed by lithography and implantation which implants first conductive type impurities to the region defined by lithography. Next, as shown in FIG. 4B, a drift region 14, a source 15a, a drain 15, a first conductive type heavily doped region 16, and a threshold voltage adjustment region 17 are formed in the device area 100. The drift region 14, the source 15a, the drain 15, and the threshold voltage adjustment region 17 are defined respectively by lithography, and are formed by implantation which implants second conductive type impurities, for example but not limited to N-type impurities, in the form of accelerated ions as indicated by the dash arrow lines in the figure, to the regions defined by lithography. The first conductive type heavily doped region 16 is defined by lithography, and is formed by implantation which implants first conductive type impurities, for example but not limited to P-type impurities, in the form of accelerated ions, to the region defined by lithography. The source 15a and the drain 15 are located beneath the gate 13 at both sides thereof, respectively. The drift region 14 is located at the drain side and part of it is beneath the gate 13. Part of the threshold voltage adjustment region 17 is beneath the gate 13; the threshold voltage adjustment region 17 converts an enhancement device to a depletion device, and it also serves for adjusting the threshold voltage of the depletion MOS device. The source 15a and the P-type heavily doped region 16 are separated by an isolation region 12.

Figure 4C:
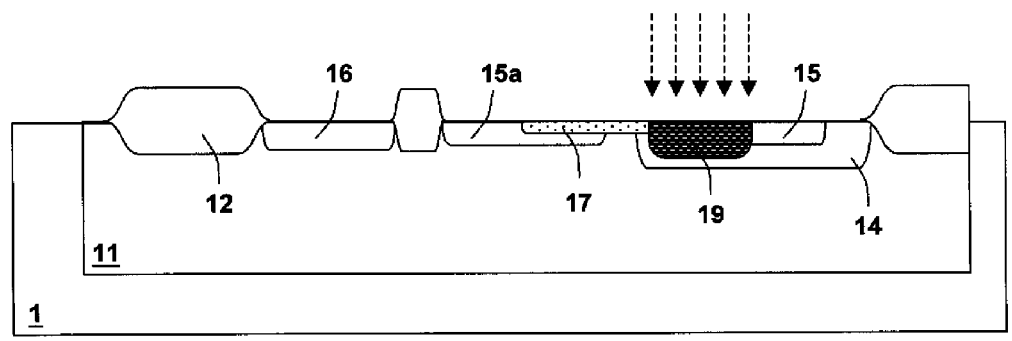

The next step is different from the prior art. As shown in FIG. 4C, an additional step is performed for forming a breakdown protection region 19. As indicated by the dash arrow lines in FIG. 4C, the breakdown protection region 19 is formed by implantation which implants first conductive type impurities, for example but not limited to P-type impurities, in the form of accelerated ions, to the defined region. The breakdown protection region 19 preferably covers an edge of the threshold voltage adjustment region 17 closer to the drain 15 side. Because the impurities in the breakdown protection region 19 is of an opposite conductive type to the impurities in the drift region 14, the drain 15, and the threshold voltage adjustment region 17, the breakdown voltage can be increased. Note that even though the breakdown protection region is implanted with impurities of the first conductive type, the device is still a depletion device, that is, the breakdown protection region 19 presents a property of lighter doped second conductive type. In one embodiment, the breakdown protection region 19 can be defined by a mask dedicated to forming the breakdown protection region. But a preferable way is to define the breakdown protection region 19 by a mask for defining other devices in the substrate 1, so as to save process steps and mask cost. Masks and process steps suitable for forming the breakdown protection region 19 will be described later.

Figure 4D:
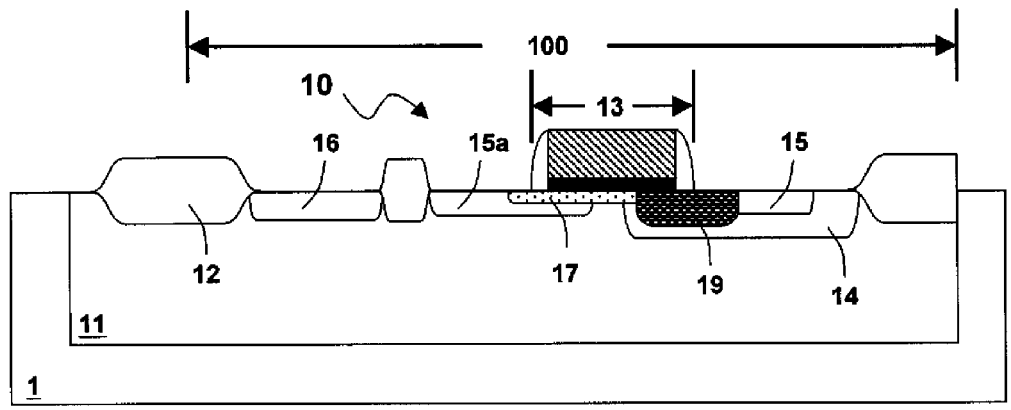

Next, as shown in FIG. 4D, the gate 13 is formed in the device area 100, and the depletion DDDMOS device 10 is completed. The gate 13 can be made of various materials and can be formed by various ways, as well known by those skilled in the art. The details thereof are omitted here.

Figure 5:
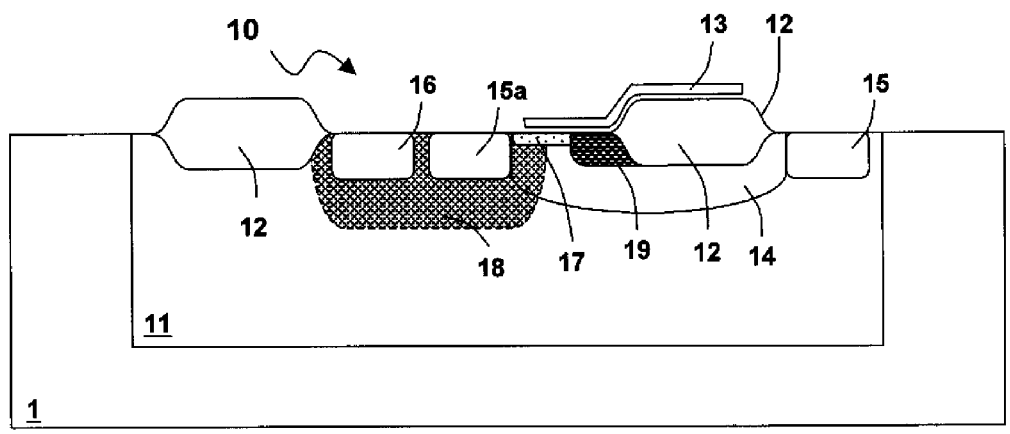
FIG. 5 shows a second embodiment of the present invention.

FIG. 5 shows a second embodiment of the present invention, which shows a cross-section view of a depletion LDMOS device formed by the method according to the present invention. The steps of manufacturing the depletion LDMOS device are similar to those of the first embodiment. In the second embodiment, similarly, the breakdown protection region preferably covers an edge of the threshold voltage adjustment region 17 closer to the drain 15 side, but in this embodiment the breakdown protection region 19 is located beneath the gate 13, in contact with or near an isolation region 12.

Figure 6:
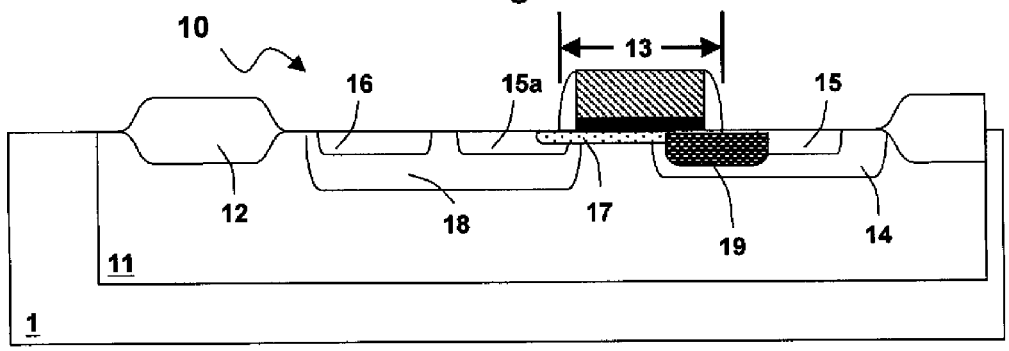
FIG. 6 shows a third embodiment of the present invention.

FIG. 6 shows a third embodiment of the present invention, which shows a cross-section view of a depletion DMOS device using the present invention. The steps of manufacturing the depletion DMOS device are similar to those of the first embodiment. In the third embodiment, similarly, the breakdown protection region 19 preferably covers an edge of the threshold voltage adjustment region 17 closer to the drain 15 side.

Figure 7:
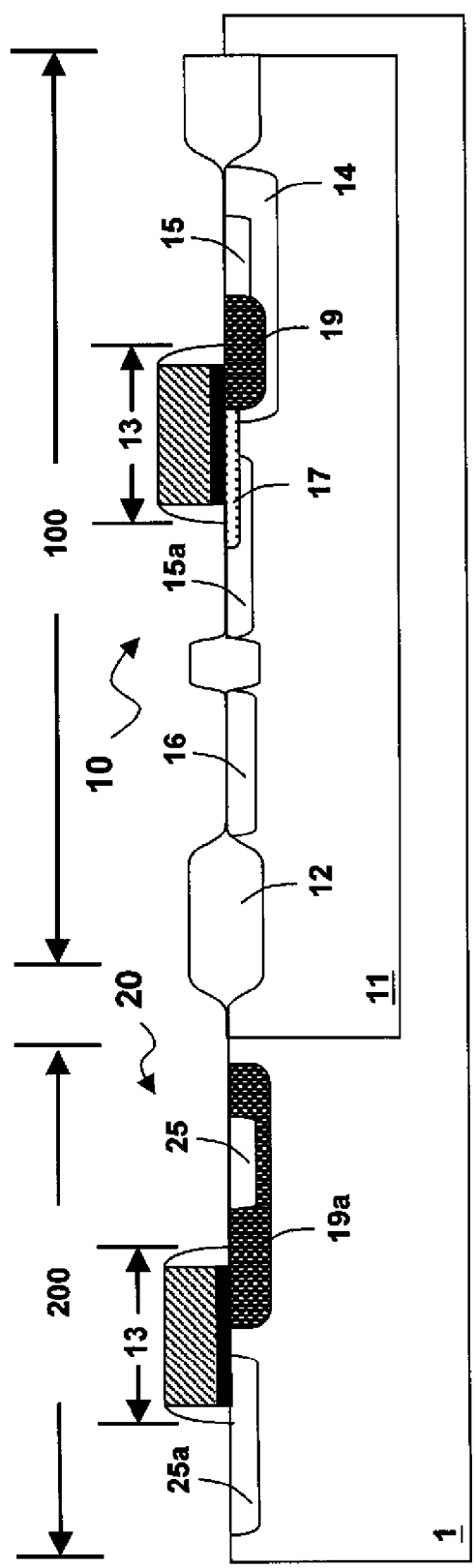
FIG. 7 shows a fourth embodiment of the present invention.

FIG. 7 shows a fourth embodiment of the present invention. This embodiment shows that, besides the deletion DDDMOS device 10 formed in the substrate 1, another MOS device 20 with an opposite conductive type is also formed in another device area 200 in the same substrate 1. This device 20 for example is an enhancement high voltage device as shown in the figure, but it is not limited to a high voltage device and it may be a low voltage device or another depletion device. Because the MOS device 20 has a conductive type opposite to the depletion DDDMOS device 10, a source 25a and a drain 25 with an opposite conductive type are formed in the MOS device 20, and generally it is required to form an LDD region 19a in the MOS device 20. Therefore, the breakdown protection region 19 of the depletion device 10 can be formed by using the mask for defining the LDD region 19a, that is, the breakdown protection region 19 and the LDD region 19a can be defined by one common mask. And in a same implantation step for forming the LDD region 19a, impurities of first conductive type are implanted to the breakdown protection region 19, so that no additional mask and implantation steps are required. Besides the mask for defining the LDD region of the opposite conductive type device, similarly, the breakdown protection region 19 of the depletion device 10 can be formed by using a mask for defining a first conductive type anti-punch through region in another MOS device in the same substrate 10, that is, the breakdown protection region 19 and the anti-punch through region can be defined by one common mask and formed by the same implantation step.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a deep well, etc., can be added. For another example, the lithography step described in the above is not limited to photolithography by a photo mask; it can be electron beam lithography, X-ray lithography, etc. In view of the foregoing, the spirit of the present invention should cover all such and other modifications and variations, which should be interpreted to fall within the scope of the following claims and their equivalents.

What is claimed is:

1. A method of manufacturing a depletion metal oxide semiconductor (MOS) device, comprising:
   providing a substrate;
   forming a first conductive type well and an isolation region in the substrate to define a device area;
   defining a drift region, a source, a drain, and a threshold voltage adjustment region in the device area, and implanting second conductive type impurities to form the drift region, the source, the drain, and the threshold voltage adjustment region, respectively, wherein the threshold voltage adjustment region is for adjusting a threshold voltage of the depletion MOS device such that the depletion MOS device becomes normally conductive, the threshold voltage adjustment region being shallower than the drift region, and the threshold voltage adjustment region and the drain being separated by the drift region;
   defining a breakdown protection region between the drain and the threshold voltage adjustment region, and implanting first conductive type impurities to form the breakdown protection region, wherein the breakdown protection region is shallower than the drift region, and the implanting of first conductive type impurities to form the breakdown protection region does not fully deplete the second conductive type impurities already existing in the breakdown protection region, such that the breakdown protection region presents second conductive type property and has a second conductive type concentration lower than the concentration of the drift region, to increase the breakdown voltage of the depletion MOS device as compared with a case where the concentration of the second conductive type impurities in the breakdown protection region is not decreased; and
   forming a gate in the device area, wherein part of the breakdown protection region is below the gate, and the breakdown protection region surrounds an edge of the threshold voltage adjustment region.

2. The method of claim 1, wherein the first conductive type is P-type and the second conductive type is N-type.

3. The method of claim 1, wherein the first conductive type is N-type and the second conductive type is P-type.

4. The method of claim 1, wherein the isolation region is formed by local oxidation of silicon (LOCOS) or shallow trench isolation (STI).

5. The method of claim 1, wherein the breakdown protection region is defined by a mask dedicated to forming the breakdown protection region.

6. The method of claim 1, further comprising: forming another MOS device with an opposite conductive type in the substrate, wherein a lightly doped drain (LDD) region mask is used to define a first conductive type LDD region of the MOS device with the opposite conductive type, and the LDD region mask is also used to define the breakdown protection region of the depletion MOS device.

7. The method of claim 1, further comprising: forming another MOS device in the substrate, wherein an anti-punch through region mask is used to define a first conductive type anti-punch through region of the MOS device, and the anti-punch through region mask is also used to define the breakdown protection region of the depletion MOS device.

8. The method of claim 1, wherein the depletion MOS device is a double diffused drain metal oxide semiconductor (DDDMOS), or a lateral diffused metal oxide semiconductor (LDMOS).

* * * * *